LAMINATED SHEET MATERIAL AND PROCESS FOR TREATING

Filed Jan. 28, 1964

Inventors:
Leon V. Larsen,
Louie P. Blanchet,
by [signature]
Their Attorney.

United States Patent Office
3,315,514
Patented Apr. 25, 1967

3,315,514

LAMINATED SHEET MATERIAL AND PROCESS FOR TREATING

Leon V. Larsen and Louie P. Blanchet, Coshocton, Ohio, assignors to General Electric Company, a corporation of New York Filed Jan. 28, 1964, Ser. No. 340,672
10 Claims. (Cl. 72—363)

Figure 1:
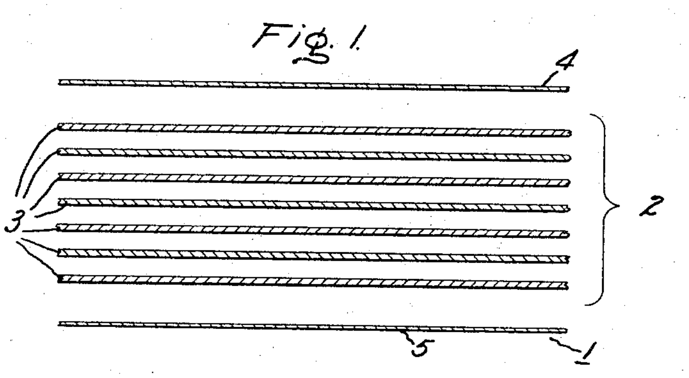

This invention relates to laminated materials. More particularly, it relates to metal-clad laminated materials which are characterized by improved surface or planar dimensional stability and to procedures for producing such laminates.

Metal-clad laminates, such as those prepared from a resin-impregnated core and provided with metal surfaces, are well known. Such laminates have found increasing use in etched circuit board or wiring card application wherein electrical circuits are etched in the metal surface and utilized for various purposes, including computer applications, where one of the requirements is that the circuit boards or etched wiring cards so prepared be dimensionally stable so that they retain their design planar or length and width dimensions throughout their fabrication so that components can be precisely located thereon. In order to increase the efficiency of such circuit boards, often both sides of the laminate are clad with a metal, such as copper or the like, so that the design of the circuit can be simplified. When laminates are clad on both sides with metal, which is later etched to provide a suitable electrical circuit and exposed to elevated temperatures, as when applying solder resists or the like, it has been found that intolerable changes in dimension of the circuit board often result so that components such as resistors, capacitors and the like cannot be properly fitted to the punched card. The stability of the doubly metal-clad laminates is further decreased by the fact that the double cladding restrains the escape shrink forces, which restraint is removed when copper is etched from the board in making an etched circuit board or card.

From the above, it will be quite apparent that there is a definite need for dimensionally stable, metal-clad laminates and for a process which will produce such laminates, and it is a primary object of this invention to provide such a process and such stabilized metal-clad laminates.

It is also an object of the invention to improve the stability of laminate sheets which are singly clad or clad on only one surface.

Briefly, it has been found that if doubly metal-clad laminated materials are heat treated to relax the material, as by heating to about 80° C. to 150° C., preferably 115° C. to 120° C., for about several hours to several minutes, cooled and subjected to a series of flexing treatments followed by heat treatment, they are made much more dimensionally stable. In general, the more vigorous the flexing treatment, the fewer is the number of such flexures required. Such flexing should, of course, stop short of breakage. According to one aspect of the invention, the laminates are passed after so heating and cooling to room temperature through a metal shaping roll system or plate bending machine with the laminate core grain direction perpendicular to the direction of travel through the plate bender or separately with both the grain and cross-grain so perpendicular.

When the grain of the laminate core is perpendicular to direction of travel through the rolls, the sheet is curved, flexed or arced in a direction which is perpendicular to the core grain direction. When the core grain direction is parallel to the direction of travel, the curving or flexing is, of course, parallel to the grain direction. When indicated, the sheet can also be flexed diagonally or at an angle to the core grain. The laminate is passed through the rolls which are adjusted to form the laminate or flex it typically into the shape roughly of a half cylinder. The half cylinder is then reversed and passed through the rolls to flex it into an oppositely disposed half cylinder shape and, finally, passed once again through the rolls which are adjusted to flatten the sheet. This flexing cycle is followed by heat treatment during which the laminate is raised to a temperature of 80° C. to 150° C., preferably, for economic reasons, 115° C. to 120° C. for as short a time as practicable varying from about thirty seconds to ten minutes and cooled to room temperature. Longer times of heating may be used but are not necessary. After heat treatment, the flexing cycle and heat treatment cycle are repeated until the desired dimensional stability is attained. It has been found that for most practical purposes as, for example, in preparing circuit boards in which the etched clad laminate may be subjected to temperatures of the order of from about 500° F. to 600° F. or more, heat treatment, two cycles of flexing, reverse flexing, flattening or straightening and heat treatment, followed by one cycle of flexing, reverse flexing and flattening, provide adequate dimensional stability. In certain cases, in order to insure that the trailing edge of the laminate is subjected to adequate flexing, such trailing edge is preflexed by passing such edge only a short distance through the rolls and the laminate then inverted and reversed before full flexing and reverse flexing. In some cases it is also found to be more convenient to trim off the leading and trailing edges of the laminate rather than to flex separately such edges. The invention can also be applied to singly clad metal laminates with salutary results.

Figure 2:
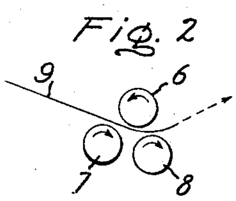
Figure 3:
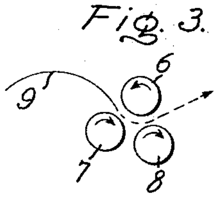
Figure 4:
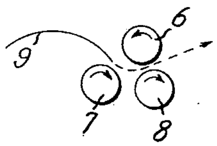

Those features of the invention which are believed to be novel are set forth with particularity in the claims appended hereto. The invention will, however, be better understood and further advantages and objects thereof appreciated from a consideration of the following description and the drawing in which FIGURE 1 shows in exploded fashion a typical laminate which is doubly metal-clad or metal-clad on both surfaces and FIGURES 2 through 4 show end views of the rolls of the roller-leveller flexing device used and typical methods of passage of the laminate through the device.

Referring to FIGURE 1, there is shown in exploded fashion a typical laminate 1 of the present invention having a core 2 made up of seven sheets 3 of paper or other usual core material, each of which is typically about 10 mils in thickness but which thickness can be varied to suit any particular application. The core is impregnated with any well-known laminating resin such as a 50% solution of a standard well-known alkaline-catalyzed phenol formaldehyde laminating resin and overlaid with metal cladding 4 and 5 which can be of any metal, such as copper, aluminum, silver, stainless steel and the like, but which will be described herein as consisting of copper. The laminate so prepared is typically raised to a temperature of about 150° C. and held at such temperature under a pressure of about 1200 lbs. per square inch for a period which causes the resin impregnant to melt, flow and cure to the relatively infusible, insoluble state securely bonding the copper foil or surface to the core. Typically, the time required for such treatment is about 20 to 30 minutes. Those skilled in the art will realize, of course, that other well-known resins besides phenolic resins may be used, such as melamine resins, epoxy resins, and the like, and that each resin has its own well-known preferred treatment or curing cycle.

It was found that a combination of heat treatment, flexing, reverse flexing and heat treatment of such metal-clad laminates produced a final product which is unexpectedly stable dimensionally when it is subjected to the etching away or removal of a substantial part of the metal cladding, as in the preparation of etched circuits or wiring cards and thereafter subjected during the making of such cards to elevated temperatures which can cause dimensional changes in the laminate. It has been found particularly advantageous to heat treat and then flex and reverse flex the laminate through a sheet metal plate bender machine or equivalent apparatus with the laminate core grain direction perpendicular to the direction of travel through the rolls or parallel to the roll axes. Additional dimensional stability for extremely precise applications can be accomplished by, in addition, treating the laminate also with the laminate grain parallel to direction of travel through the rolls. The laminate is passed through the rolls adjusted a first time to form substantially a half cylinder, such half cylinder then being inverted or turned over and passed once again through the rolls to reverse flex or form substantially a half cylinder in the reverse direction. Next, the arcuate sheet is inverted and passed through the rolls which are adjusted to flatten the sheet. The sheet is then placed in an oven or other suitable heating device to raise the temperature as rapidly as possible to about 80° C. to 150° C., preferably 115° C. to 120° C., after which the laminate is immediately removed and allowed to cool to room temperature. Preferably, the time to temperature should be from about 30 seconds to 10 minutes and cooling devices are often advantageously used to lower immediately the temperature of the laminate to room temperature. It will be realized that the heat treatments are of a time temperature nature and can be accomplished in any manner which will not destroy the laminate. The above cycle of heat treating, flexing, reverse flexing, straightening and heating is repeated for as many times as are necessary to produce dimensional stability for any particular purpose. However, it has been found that for all practical purposes dimensionally stable, doubly metal-clad laminates are produced when they are subjected to three cycles of heat treatment, flexing, reverse flexing, straightening and heat treatment. The heat treatment can usually be omitted during the last cycle. Additional treatment cycles, while they may be advantageous in some instances, afforded diminishing results for the work involved.

It is preferable in forming the semicylindrical flexed shape that such shape be slightly less than semicylindrical in order to obviate scratches when, during a production process, it is found to be convenient to stack a number of such arcuate pieces in a nesting manner. Generally speaking, bending to within about one inch of a semicylindrical arcuate shape is preferred.

The actual flexing of the laminate will be better seen by reference to FIGURES 2 through 4 of the drawing in which 6, 7 and 8 are end views of the rolls of the roller-leveller machine and 9 represents the laminate passing through the rolls. The unnumbered arrows indicate the directions of rotation of the rolls and travel of the laminate. In FIGURE 2 the laminate is in the process of being formed into a substantially semicylindrical or arcuate shape with its free ends directed upward. In FIGURE 3 the arcuate shape produced by passing the laminate through the rolls as in FIGURE 2 is inverted or upset and, once again, is being passed through the rolls to produce a fixed reverse arcuate shape, again with its free ends directed upward. FIGURE 4 illustrates the passage of the laminate through the rolls which are so adjusted in a well-known manner as to produce a flat sheet from the arcuate-shaped laminate 9. As pointed out above, the process illustrated in FIGURES 2, 3 and 4 along with the heat treatment are repeated such number of times as will produce the desired dimensional stability.

In some cases, where it is particularly important that the entire circuit board or other structure formed from the laminate sheets so treated has absolutely uniform dimensional stability throughout, the leading and trailing edges of the laminate sheet are trimmed off since, as will be apparent, the ends of the sheet are sometimes not subjected to the same degree of flexing as the central part or leading edge of the sheet. In lieu of trimming the leading and trailing edges of the laminate sheet, an edge of the sheet may be passed partially through the rolls as in FIGURE 2, as for about six inches, the laminate sheet being reversed and the opposite end of the sheet then passed through the roll as in FIGURE 2 to form a substantially semicylindrical arcuate shape. This same effect can be obtained to a degree by reversing the leading and trailing edges during each flexing pass through the rolls.

The following example will illustrate the practice of the present invention, it being realized that such example is illustrative only and is not to be taken as limiting in any way.

A laminate sheet thirty-nine inches square prepared from an epoxy resin-impregnated cellulosic core and clad on each face with copper foil 0.0014 inch in thickness and having an over-all thickness of about 0.060 inch was treated as follow: The sheet was heated for one hour at 105° C. and cooled to room temperature. The rolls which were two inches in diameter and as shown in FIGURE 2 were so adjusted as to provide a clearance of about 0.250 inch between rolls 6 and 7 and a clearance of about 0.062 inch between rolls 6 and 8. The sheet was passed through the rolls as in FIGURE 2 with the laminate grain direction perpendicular to the direction of travel through the rolls to form a roughly semicylindrical piece having its free ends directed upward. This arcuate or semicylindrical shape was inverted and with its leading edge downward was passed through the rolls as in FIGURE 3, rolls 6 and 7 and 6 and 8 having the same relative clearances as above. After passing through the rolls as in FIGURE 3, the laminate sheet 9 had been reverse flexed to a roughly semicylindrical shape having its free ends directed upwardly. The next step in the process is to straighten the laminate and this procedure is shown in FIGURE 4 wherein, for the particular example, the distance between rolls 6 and 7 is adjusted at about 0.400 inch and the distance between rolls 6 and 8 adjusted to about 0.250 inch. The laminate sheet 9, after passing through the rolls as spaced in FIGURE 4, is flat and ready for heat treatment. Of course, separate machines can be used for continuous flexing and flattening. As pointed out above, the laminate is raised to its proper temperature as rapidly as possible and then cooled. In the particular example, the laminate is raised to a temperature of 115° C. to 120° C. in eight minutes, immediately removed from temperature and cooled to room temperature. The above cycle of heating, flexing, reverse flexing, straightening and heating was repeated twice for a total of three cycles, except that the heat treating was omitted at the end of the last cycle. Etched wiring cards were prepared from the above sheets and were subjected to a temperature of 120° C. for one hour to simulate typical processing of a card. Cards flexed as above had an average change of 0.00010 inch per inch whereas cards not so treated had an average corresponding change of 0.00080 inch per inch. When the leading and trailing edges were separately flexed by passing such edges about six inches through the rolls, the average dimensional change as above was reduced to about 0.00006 inch per inch.

While the present invention is particularly useful in connection with laminated sheets for wiring cards which are clad on each face or surface with metal, it is also applicable to such cards which are clad on only one surface. The following example illustrates the efficacy of the invention as applied to such singly clad cards or boards.

Laminated sheets having the same thicknesses as in the previous example and having dimensions of 12 inches by 15 inches and clad on only one side with metal as above were heat treated for thirty minutes at 120° C. and cooled to room temperature. The sheets were then treated as in the previous example, the cycle of heating, flexing, reverse flexing, straightening and heating being the same as in the above example. Etched wiring cards were prepared from the above sheets and subjected to a temperature of 120° C. for about one hour to simulate the typical processing of such a card. Cards flexed as above had an average change of 0.00048 inch per inch whereas cards not so treated had an average corresponding dimensional change of 0.00293 inch per inch.

There are provided, then, by the present invention metal-clad laminate sheets for etched circuit boards or etched wiring cards which are by reason of their described treatment rendered much more dimensionally stable so that circuit cards prepared therefrom, even after a substantial part of the metal cladding has been etched away or otherwise removed, can be employed in applications which require precise locating of components thereon.

While particular means of flexing are shown herein, any well-known other equivalent flexing means can be used. Likewise, while the invention has been described with relation to metal-clad laminates, it relates as well to and includes laminates clad with other materials which are equivalent to metals in the restraining action on the free relaxation of the laminate core material.

What we claim as new and desire to secure by Letters Patent of the United States is:

1. The process of treating laminated sheet material, said material being clad on each face with a metal, which comprises heat treating, flexing, reverse flexing, flattening and heat treating said sheet at least once.

2. The process of treating metal-clad laminated sheet which comprises (a) heat treating said sheet to relax the material,
(b) flexing said sheet,
(c) reverse flexing said sheet,
(d) flattening said sheet,
(e) heat treating said sheet to relax said material, and
(f) repeating (b) through (e) until the desired dimensional stability is attained, omitting step (e) during the last cycle.

3. The method of improving the dimensional stability of metal-clad laminated sheet material which comprises (a) heat treating said sheet to relax the material,
(b) flexing said sheet to an arcuate shape,
(c) reverse flexing said arcuate shaped sheet into an oppositely disposed arcuate shape,
(d) flattening said arcuate shaped sheet,
(e) heat treating said sheet to relax said material, and
(f) repeating (b) through (e) until the desired dimensional stability is attained, omitting step (e) at the end of the last cycle.

4. The method of improving the dimensional stability of laminated sheet material clad on at least one surface with metal which comprises (a) heating treating said sheet to relax said material,
(b) flexing said sheet into a substantially semicylindrical shape,
(c) reverse flexing said semicylindrincal shape into an oppositely disposed substantially semicylindrical arcuate shape,
(d) flattening said arcuate shaped sheet,
(e) heat treating said sheet by raising it to a temperature of from about 115° C. to 120° C. in a time ranging up to about ten minutes and cooling quickly to room temperature and
(f) repeating (b) through (e) until the desired dimensional stability is attained, omitting step (e) during the last cycle.

5. The method of improving the dimensional stability of laminated sheet material clad on at least one surface with metal which comprises (a) heat treating said sheet to relax said material,
(b) flexing said sheet into a substantially semicylindrical shape, (c) reverse flexing said semicylindrical shape into an oppositely disposed substantially semicylindrical arcuate shape,
(d) flattening said arcuate shaped sheet,
(e) heat treating said sheet by raising it to a temperature of from about 80° C. to 150° C. in a time ranging up to about ten minutes and cooling quickly to room temperature and
(f) repeating (b) through (e) until the desired dimensional stability is attained, omitting step (e) during the last cycle.

6. The process of treating laminated sheet material clad on at least one face with a metal which comprises (a) heat treating to relax said material,
(b) flexing an edge of said sheet by passing it a short distance through the rolls of a plate bending machine,
(c) withdrawing said sheet,
(d) reversing said sheet and flexing it by passing it completely through said rolls,
(e) reverse flexing said sheet by passing it through said rolls,
(f) flattening said sheet by passing it through said rolls which are adjusted to so flatten said sheet,
(g) heat treating said sheet and
(h) repeating (b) through (g) at least once.

7. The process of treating laminated sheet materials, said material being clad on at least one face with a metal which comprises (a) heat treating to relax said material,
(b) flexing said sheet into an arcuate shape,
(c) reverse flexing said sheet into an oppositely disposed arcuate shape,
(d) flattening said sheet, and
(e) heat treating to relax said material, said process of (a) through (e) being carried out at least once with the drain direction of the core of said sheet parallel to the direction of flexing and (b) through (e) at least once with said grain direction perpendicular to said flexing direction, step (e) being omitted during the last cycle.

8. The process of treating laminated sheet material, said material being clad on at least one surface with a metal which comprises (a) heat treating said material to relax said material,
(b) flexing said sheet to an arcuate shape,
(c) reverse flexing said sheet,
(d) flattening said sheet, and
(e) heat treating said sheet to relax said material, steps (b) through (e) being repeated at least once, the grain of the core of said sheet being perpendicular to the direction of said flexing.

9. The process of treating laminated sheet material, said material being clad on at least one surface with a metal which comprises (a) heat treating said material to relax said material,
(b) flexing said sheet to an arcuate shape,
(c) reverse flexing said sheet,
(d) flattening said sheet, and
(e) heat treating said sheet to relax said material, steps (b) through (e) being repeated at least once, the grain of the core of said sheet being parallel to the direction of flexing.

10. The product produced by the process of claim 1.

References Cited by the Examiner

UNITED STATES PATENTS

| | | | |
|---|---|---|---|
| 2,392,323 | 1/1946 | Koss | 72—366 |
| 2,668,348 | 2/1954 | Hubbell | 29—195 |
| 3,109,331 | 11/1963 | Cordray et al. | 72—363 |

CHARLES W. LANHAM, *Primary Examiner.*

L. A. LARSON, *Assistant Examiner.*